(12) United States Patent
Tseng et al.

(10) Patent No.: US 8,350,337 B2
(45) Date of Patent: Jan. 8, 2013

(54) SEMICONDUCTOR DEVICE AND METHOD OF FORMING THE SAME

(75) Inventors: Kun-Szu Tseng, Tainan County (TW); Cheng-Wen Fan, Tainan County (TW); Chih-Yu Tseng, Hsinchu (TW); Victor Chiang Liang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 367 days.

(21) Appl. No.: 12/648,873

(22) Filed: Dec. 29, 2009

(65) Prior Publication Data
US 2011/0156161 A1 Jun. 30, 2011

(51) Int. Cl.
*H01L 27/06* (2006.01)
*H01L 21/8234* (2006.01)

(52) U.S. Cl. ........... 257/379; 438/238; 257/E27.016; 257/E21.616

(58) Field of Classification Search .......... 257/379, 257/E27.016, E21.616; 438/238
See application file for complete search history.

(56) References Cited

U.S. PATENT DOCUMENTS

| | | | |
|---|---|---|---|
| 6,405,096 B1 | 6/2002 | Toprac et al. | |
| 6,406,956 B1 | 6/2002 | Tsai et al. | |
| 6,465,829 B2 * | 10/2002 | Takeda et al. | 257/300 |
| 6,897,075 B2 | 5/2005 | Bode et al. | |
| 7,067,379 B2 * | 6/2006 | Wen et al. | 438/300 |
| 7,932,146 B2 | 4/2011 | Chen et al. | |
| 7,947,588 B2 * | 5/2011 | Yu et al. | 438/585 |
| 2010/0052058 A1 * | 3/2010 | Hsu et al. | 257/364 |
| 2010/0320544 A1 * | 12/2010 | Tseng et al. | 257/380 |
| 2011/0117710 A1 | 5/2011 | Lin et al. | |

OTHER PUBLICATIONS

U.S. Appl. No. 12/488,592, filed Jun. 22, 2009, Tseng et al.
U.S. Appl. No. 12/432,772, filed Apr. 30, 2009, Wang et al.

* cited by examiner

*Primary Examiner* — Calvin Lee
*Assistant Examiner* — Monica D Harrison
(74) *Attorney, Agent, or Firm* — Ding Yu Tan

(57) ABSTRACT

A semiconductor device including a substrate, a first device, a second device and an interlayer dielectric layer is provided. The substrate has a first area and a second area. The first device is disposed in the first area of the substrate and includes a first dielectric layer on the substrate and a metal gate on the first dielectric layer. The second device is in the second area of the substrate and includes a second dielectric layer on the substrate and, a polysilicon layer on the second dielectric layer. It is noted that the height of the polysilicon layer is less than that of the metal gate of the first device. The interlayer dielectric layer covers the second device.

23 Claims, 7 Drawing Sheets

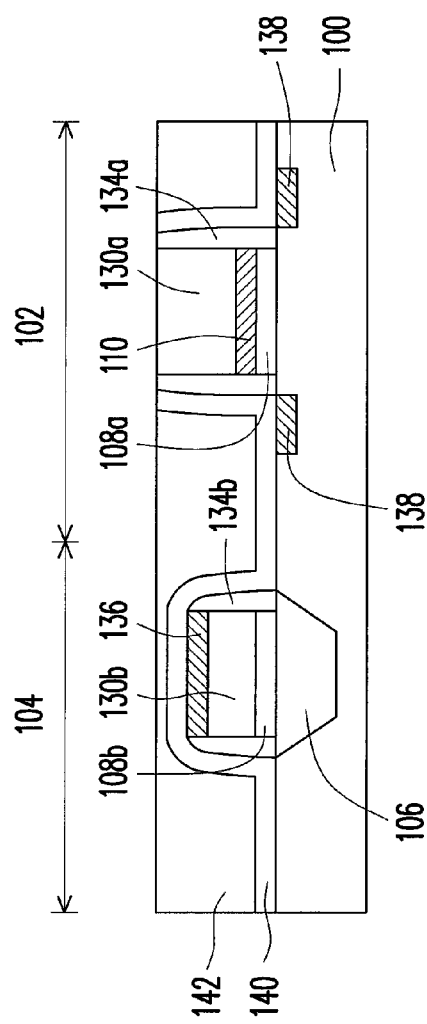
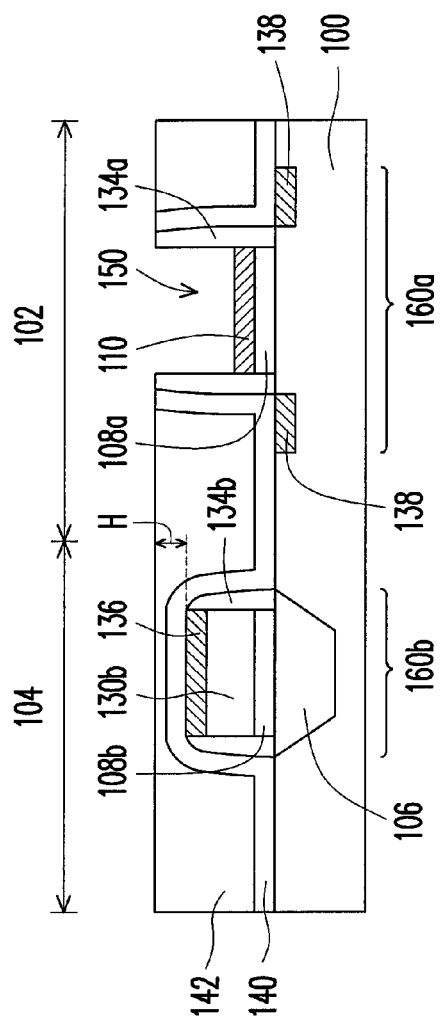

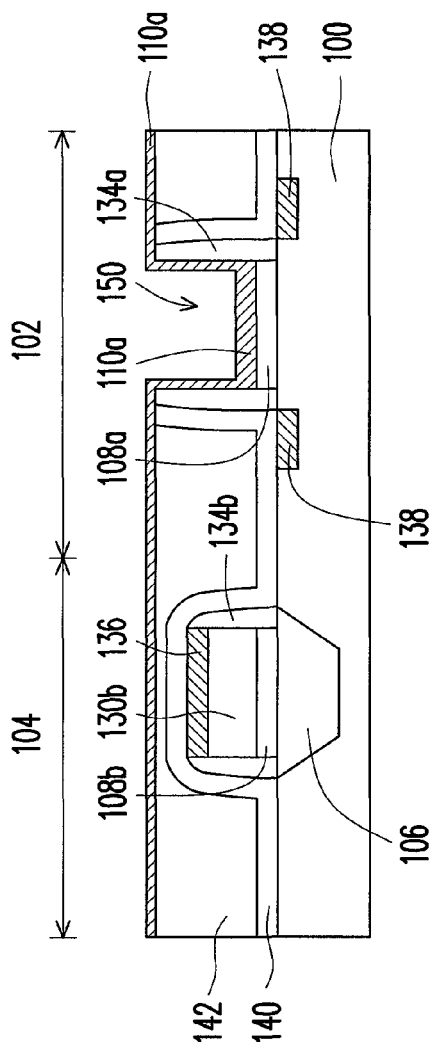
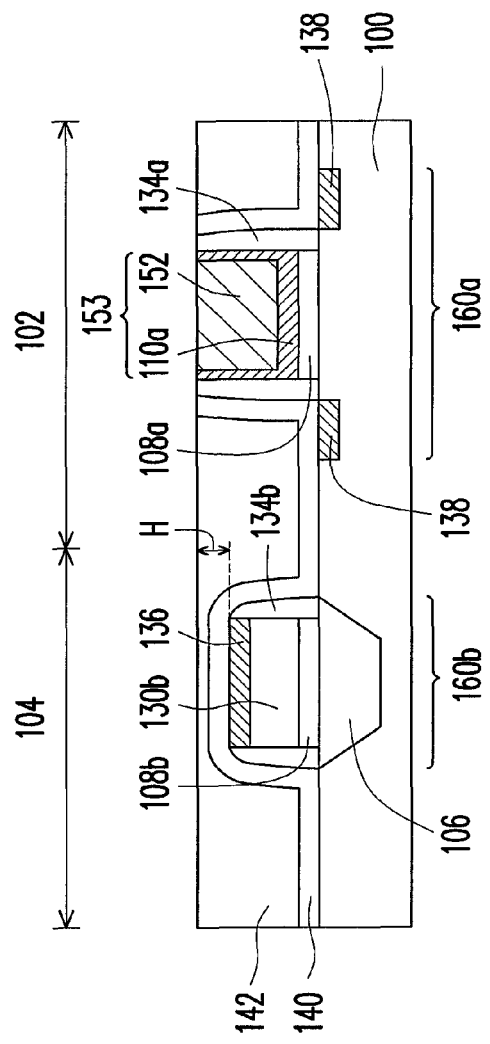
FIG. 1K
FIG. 1L

SEMICONDUCTOR DEVICE AND METHOD OF FORMING THE SAME

BACKGROUND OF THE INVENTION

1. Field of Invention

The present invention relates to a semiconductor device and a method of forming the same, and more generally to a semiconductor device including a polysilicon resistor and/or a polysilicon fuse and a MOS transistor having a metal gate and a method of forming the same.

2. Description of Related Art

As the dimension of a semiconductor device is getting smaller, the dimension of the gate structure and the thickness of the gate insulation layer are reduced accordingly. However, a leakage current occurs when the gate insulation layer of silicon oxide becomes thinner. To reduce the leakage current, a high dielectric constant (high-k) material is used to replace silicon oxide for forming the gate insulation layer. When the high-k material serves as the material of the gate insulation layer, the gate of polysilicon may react with the high-k material to generate a Fermi-level pinning, so as to increase the threshold voltage and affect the performance of the device. Therefore, a metal gate is used instead of a polysilicon gate nowadays.

As described above, when the polysilicon gate is replaced by the metal gate, the polysilicon layer of a resistor or a fuse structure in the semiconductor device is also replaced by the metal layer. The resistor and the fuse are required to have higher resistance based on the IC design requirement. However, since the polysilicon layer of the resistor or the fuse structure in the semiconductor device is replaced by the metal layer, the resistance of the resistor and the fuse is not high enough.

SUMMARY OF THE INVENTION

The present invention provides a semiconductor device and a method of forming the same. A polysilicon resistor and/or a polysilicon fuse and a MOS transistor having a metal gate can be formed simultaneously, so that the better performance of the MOS transistor is obtained and the IC design requirement of the resistor and/or the fuse is satisfied.

The present invention provides a semiconductor device including a substrate, a first device, a second device and an interlayer dielectric layer. The substrate has a first area and a second area. The first device is disposed in the first area of the substrate and includes a first dielectric layer and a metal gate. The first dielectric layer is disposed on the substrate. The metal gate is disposed on the first dielectric layer. The second device is disposed in the second area of the substrate and includes a second dielectric layer and a first polysilicon layer. The second dielectric layer is disposed on the substrate. The first polysilicon layer is disposed on the second dielectric layer, wherein the height of the first polysilicon layer is less than that of the metal gate of the first device. The interlayer dielectric layer covers the second device.

According to an embodiment of the present invention, the height difference between the metal gate of the first device and the first polysilicon layer of the second device is about 50~500 angstroms, for example.

According to an embodiment of the present invention, the semiconductor device further includes a third device disposed in the second area of the substrate and having a third dielectric layer and a second polysilicon layer. The third dielectric layer is disposed on the substrate. The second polysilicon layer is disposed on the third dielectric layer, wherein the height of the second polysilicon layer is less than that of the metal gate of the first device. Further, the interlayer dielectric layer covers the third device.

According to an embodiment of the present invention, the height difference between the metal gate of the first device and the second polysilicon layer of the third device is about 50~500 angstroms, for example.

According to an embodiment of the present invention, the first device is a MOS transistor, the second device one of a resistor and a fuse, and the third device is the other one of the resistor and the fuse.

According to an embodiment of the present invention, the first device further comprises a first spacer disposed on a sidewall of the metal gate; the second device further comprises a second spacer disposed on a sidewall of the first polysilicon layer; and the third device further comprises a third spacer disposed on a sidewall of the second polysilicon layer.

According to an embodiment of the present invention, the metal gate includes a work function layer and a low resistance metal layer, and the work function layer is disposed between the low resistance metal layer and the first dielectric layer.

According to an embodiment of the present invention, the first device further includes a source and drain metal silicide layer disposed on the surface of the substrate beside the metal gate.

According to an embodiment of the present invention, the semiconductor device further includes a protection layer covering the second device and disposed between the interlayer dielectric layer and the second device.

The present invention further provides a method of forming a semiconductor device. A substrate having a first area and a second area is provided. A first stacked pattern including a first dielectric layer and a first polysilicon layer is formed in the first area, and a second stacked pattern including a second dielectric layer and a second polysilicon layer is formed in the second area, wherein the first stacked pattern has a height different from that of the second stacked pattern. An interlayer dielectric layer is completely formed on the substrate. A planarization process is performed, so as to remove a portion of the interlayer dielectric layer until the surface of the first polysilicon layer of the first stacked pattern is exposed. The exposed first polysilicon layer of the first stacked pattern is removed to form an opening. A metal gate is formed in the opening.

According to an embodiment of the present invention, the first stacked pattern and the second stacked pattern are formed by the following steps. A dielectric layer and a polysilicon layer are sequentially forming on the substrate. The polysilicon layer and the dielectric layer are patterned, so as to form the first dielectric layer and the first polysilicon layer in the first area and form the second dielectric layer and the second polysilicon layer in the second area. A portion of the second polysilicon layer is removed, so as to provide a height difference between the second polysilicon layer and the first polysilicon layer.

According to an embodiment of the present invention, the height difference between the second polysilicon layer and the first polysilicon layer is about 50~500 angstroms, for example.

According to an embodiment of the present invention, the method further includes forming a first hard mask layer and a second hard mask layer respectively on the first polysilicon layer and the second polysilicon layer. Further, the method further includes removing the second hard mask layer before the step of removing the portion of the second polysilicon layer. In addition, the method further includes removing the first hard mask layer during the step of performing the planarization process.

According to an embodiment of the present invention, the method further includes, after the step of removing the second hard mask layer, forming a metal silicide layer on the second polysilicon layer and forming a source and drain metal silicide layer on a surface of the substrate beside the metal gate.

According to an embodiment of the present invention, the method further includes forming a work function layer between the dielectric layer and the polysilicon layer.

According to an embodiment of the present invention, the method further includes patterning the work function layer before the step of forming the polysilicon layer.

According to an embodiment of the present invention, the step of patterning the work function layer and the step of removing the second hard mask layer use the same photomask.

According to an embodiment of the present invention, the method further includes, after the step of removing the exposed first polysilicon layer to form the opening, forming a work function layer on a surface of the opening.

According to an embodiment of the present invention, the method further includes, before the step of forming the interlayer dielectric layer, forming a protection layer on the first polysilicon layer and the second polysilicon layer.

According to an embodiment of the present invention, the method further includes, during the step of performing the planarization process, removing the protection layer on the first polysilicon layer.

According to an embodiment of the present invention, the method further includes forming a third stacked pattern including a third dielectric layer and a third polysilicon layer in the second area, wherein the third stacked pattern has a height different from that of the third stacked pattern.

According to an embodiment of the present invention, the method of forming the third stacked pattern includes forming the third dielectric layer and the third polysilicon layer in the second area during the step of patterning the dielectric layer and the polysilicon layer. In addition, the method further includes removing a portion of the third polysilicon layer so as to provide a height difference between the third polysilicon layer and a first polysilicon layer during the step of removing the portion of the second polysilicon layer. Moreover, the interlayer dielectric layer further covers the third polysilicon layer.

According to an embodiment of the present invention, the height difference between the third polysilicon layer and the first polysilicon layer is about 50~500 angstroms, for example.

According to an embodiment of the present invention, the method further includes forming a first spacer on a sidewall the first polysilicon layer; forming a second spacer on a sidewall the second polysilicon layer; and forming a third spacer on a sidewall the third polysilicon layer.

In view of the above, in the present invention, a polysilicon resistor and/or a polysilicon fuse and a MOS transistor having a metal gate can be formed simultaneously on the substrate. Specifically, the height of the metal gate of the MOS transistor is more than that of the polysilicon layer of the resistor and/or the fuse. Therefore, not only the better device performance of the MOS transistor is obtained but also the IC design requirement of the resistor and/or fuse is satisfied. Further, peeling of the polysilicon layer of the resistor and/or the fuse during the manufacturing process can be avoided.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A to 1L schematically illustrate cross-sectional views of a process flow of a semiconductor device according to an embodiment of the present invention.

DESCRIPTION OF EMBODIMENTS

Figure 1A:
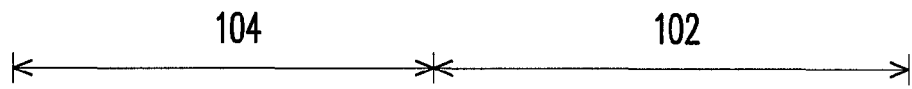
Figure 1A:
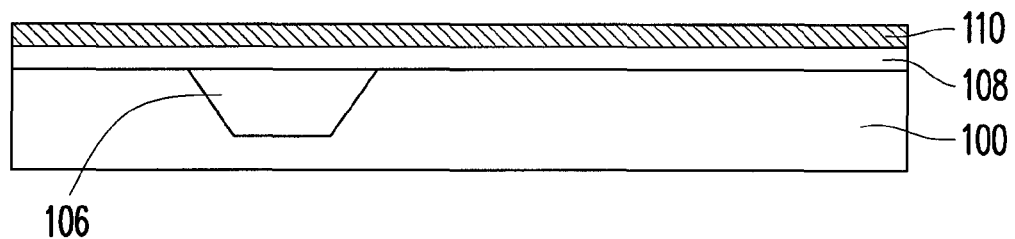

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1L schematically illustrate cross-sectional views of a process flow of a semiconductor device according to an embodiment of the present invention. Referring to FIG. 1A, a substrate 100 having a first area 102 and a second area 104 is provided. The substrate 100 may be a silicon substrate or a semiconductor substrate. The first area 102 is mainly for forming a low-resistance device, such as a MOS transistor or another similar device. The second area 104 is mainly for forming a high-resistance device, such as a resistor, a fuse or another similar device. This embodiment in which a MOS transistor is formed in the first area 102 and a resistor is formed in the second area 104 is provided for illustration purposes, and is not construed as limiting the present invention.

Afterwards, a dielectric layer 108 is formed on the substrate 100. The dielectric layer 108 may be a high-k material layer. The high-k material layer includes a material with a dielectric constant greater than 4, such as $HfO_2$, $ZrO_2$, $Al_2O_3$, AlN, $TiO_2$, $La_2O_3$, $Y_2O_3$, $Gd_2O_3$, $Ta_2O_5$ or a combination thereof, for example. The method of forming the high-k material layer includes performing a chemical vapor deposition (CVD) process, for example. Further, according to an embodiment of the present invention, the dielectric layer 108 can be a single dielectric layer (e.g. a single high-k material layer) or a structure including multiple dielectric layers. If the dielectric layer 108 is the structure including multiple dielectric layers, the dielectric layer 108 can be a two-layer stacked structure including, from bottom to top, an adhesion layer and a high-k material layer, or a three-layer stacked structure including, from bottom to top, an adhesion layer, a high-k material layer and a capping layer, or a multi-layer stacked structure including more than three layers. The adhesion layer is mainly for increasing the adhesion between the high-k material layer and the substrate. The adhesion layer includes silicon oxide, and the forming method thereof includes performing a thermal oxide process, for example. The capping layer includes a dielectric material or an insulation material. The material of the capping layer is chosen depending on the conductivity type of the device on the substrate 100. For example, the capping layer for a PMOS transistor may be different from that for an NMOS transistor.

Afterwards, a dielectric layer 108 is formed on the substrate 100. The dielectric layer 108 may be a high-k material layer. The high-k material layer includes a material with a dielectric constant greater than 4, such as $HfO_2$, $ZrO_2$, $Al_2O_3$, AlN, $TiO_2$, $La_2O_3$, $Y_2O_3$, $Gd_2O_3$, $Ta_2O_5$ or a combination thereof, for example. The method of forming the high-k material layer 106 includes performing a chemical vapor deposition (CVD) process, for example. Further, according to an embodiment of the present invention, the dielectric layer 108 can be a single dielectric layer (e.g. a single high-k material layer) or a structure including multiple dielectric layers. If the dielectric layer 108 is the structure including multiple dielectric layers, the dielectric layer 108 can be a two-layer stacked structure including, from bottom to top, an adhesion layer and a high-k material layer, or a three-layer stacked structure including, from bottom to top, an adhesion layer, a high-k material layer and a capping layer, or a multi-layer stacked structure including more than three layers. The adhesion layer is mainly for increasing the adhesion between the high-k material layer and the substrate. The adhesion layer includes silicon oxide, and the forming method thereof includes performing a thermal oxide process, for example. The capping layer includes a dielectric material or an insulation material. The material of the capping layer is chosen depending on the conductivity type of the device on the substrate 100. For example, the capping layer for a PMOS transistor may be different from that for an NMOS transistor.

According to a preferred embodiment of the present invention, after the step of forming the dielectric layer 108, the method further includes forming a work function layer 110 on the dielectric layer 108. The work function layer 110 includes TiN, TaC, TaCNO, TaCN. $TiAl_x$ or TaN, for example. The work function layer 110 includes a material of the desired work function value, and is not limited by the above-mentioned materials. Generally, the desired work function value of the work function layer 110 is about 4.1 eV for an NMOS transistor and about 5.1 eV for a PMOS transistor. The method of forming the work function layer 110 includes performing a CVD process or a physical vapor deposition (PVD) process, for example. In an embodiment, when the first area 102 is for forming an NMOS transistor, the work function layer 110 includes $TiAl_x$. In another embodiment, when the first area 102 is for forming a PMOS transistor, the work function layer 110 includes TiN. According to another embodiment, the materials of the work function layers in the NMOS transistor and the PMOS transistor are the same.

Figure 1B:
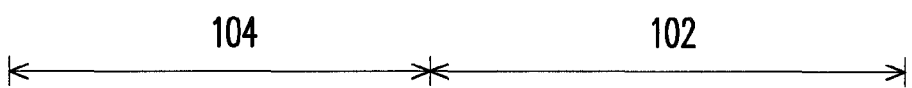
Figure 1B:
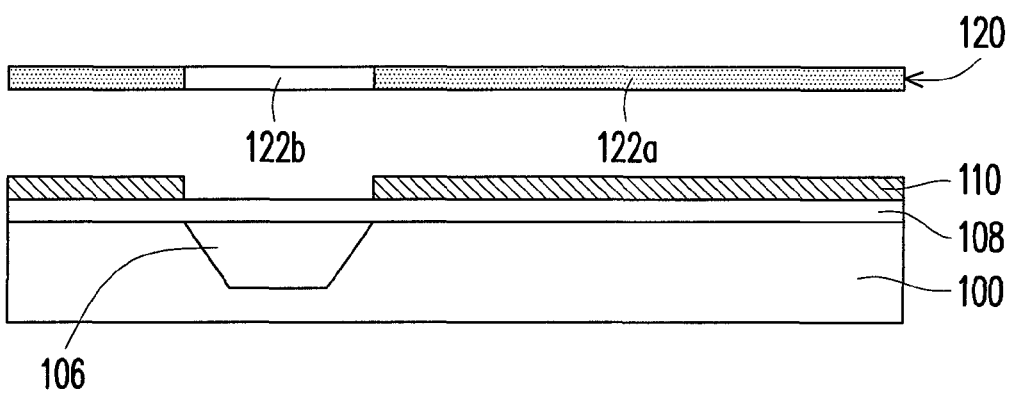

Afterwards, the work function layer 110 is patterned, so as to expose the dielectric layer 108 on the isolation structure 106 in the second area 104, as shown in FIG. 1B. In this embodiment, the method of patterning the work function layer 110 includes installing a photomask 120 (or a reticle) above the substrate 100. The photomask 120 has an opaque region 122a and a transparent region 122b. A photoresist layer (not shown) is coated on the work function layer 110, and an exposure step with the photomask 120 and a development step are then performed to the photoresist layer. Thereafter, the work function layer 110 is etched by using the patterned photoresist layer as a mask, so as to remove the work function layer 110 on the isolation structure 106.

Figure 1C:
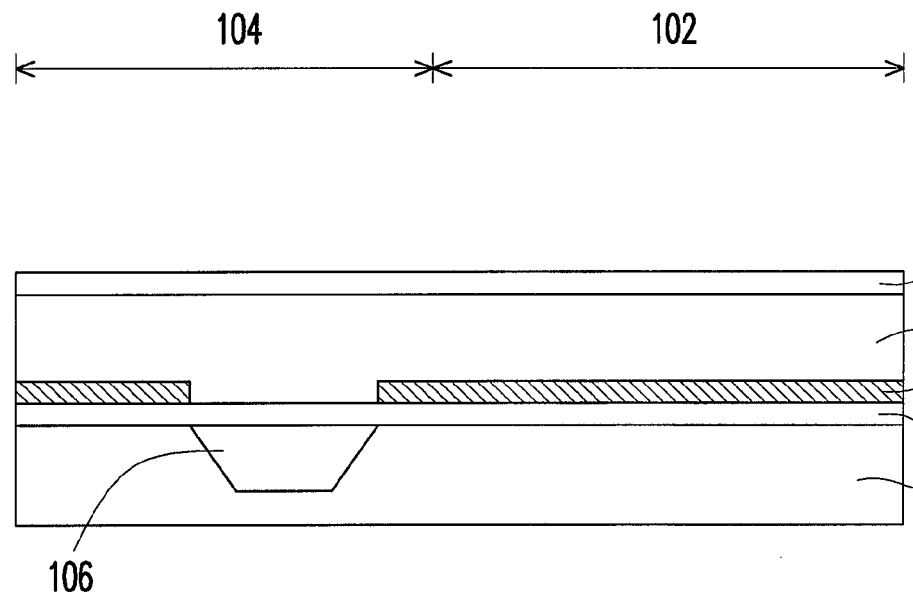

Referring to FIG. 1C, a polysilicon layer 130 is formed on the substrate 100. The thickness of the polysilicon layer 130 is about 300-1200 angstroms, and the method of forming the same includes performing a CVD process, for example. Thereafter, a hard mask layer 132 is formed on the polysilicon layer 130. The thickness of the hard mask layer 132 is about 50-600 angstroms, for example. The hard mask layer 132 includes a material having an etching selectivity high enough with respect to the polysilicon layer 130, such as silicon nitride or silicon oxynitride (SiON). The method of forming the hard mask layer 132 includes performing a CVD or PVD process, for example.

Figure 1D:
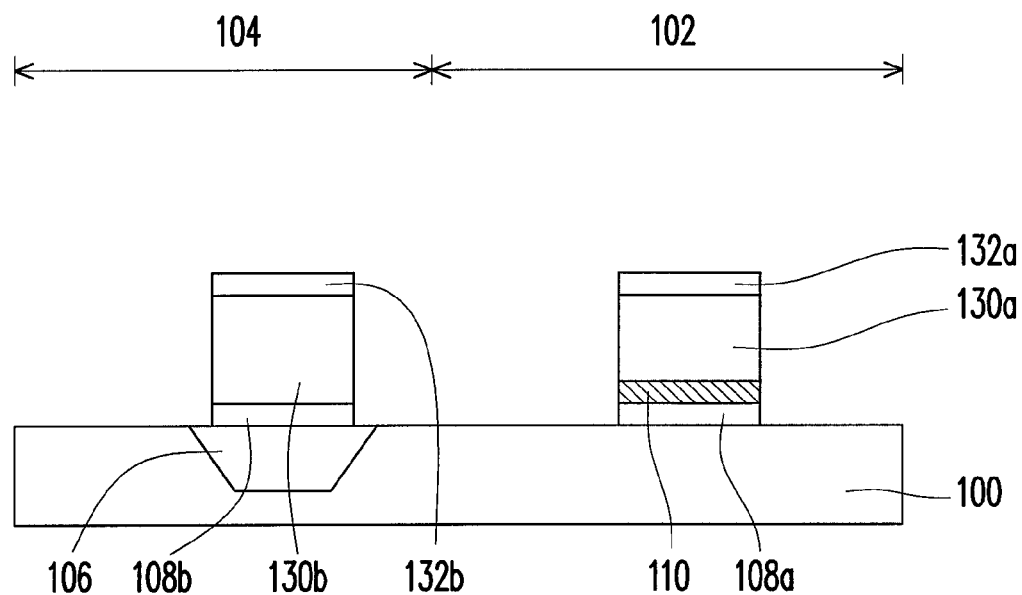

Referring to FIG. 1D, the hard mask layer 132, the polysilicon layer 130 and the work function layer 110 and the dielectric layer 108 are patterned, so as to form a first hard mask layer 132a, a first polysilicon layer 130a, a work function layer 110 and a first dielectric layer 108a in the first area 102, which is so-called a first stacked pattern, and form a second hard mask layer 132b, a second polysilicon layer 130b and a second dielectric layer 108b in the second area 104, which is so-called a second stacked pattern. The patterning process includes performing general lithography and etching processes, for example.

After the patterning process is completed, lightly doped regions (not shown) may be formed in the substrate 100 beside the first polysilicon layer 130a in the first area 102 according to an embodiment. When the first area 102 is for forming an NMOS transistor, the lightly doped regions are N-type lightly doped regions. When the first area 102 is for forming a PMOS transistor, the lightly doped regions are P-type lightly doped regions. According to another embodiment, before forming the lightly doped regions, a spacer (not shown) may be optionally formed on sidewalls of the first polysilicon layer 130a and the second polysilicon layer 130b.

Figure 1E:
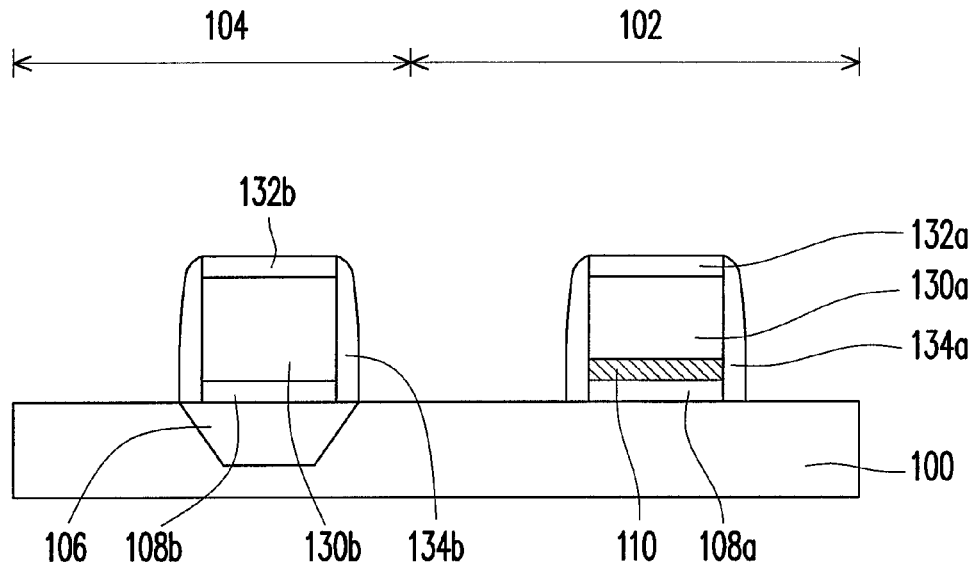

Referring to FIG. 1E, a first spacer 134a is formed on the sidewall of the first polysilicon layer 130a, and a second spacer 134b is formed on the sidewall of the second polysilicon layer 130b. In details, the first spacer 134a is formed on the sidewalls of the first hard mask layer 132a, the first polysilicon layer 130a, the work function layer 110 and the first dielectric layer 108a. The second spacer 134b is formed on the sidewalls of the second hard mask layer 132b, the second polysilicon layer 130b and the second dielectric layer 108b. The spacer 134a and the spacer 134b include silicon oxide, silicon nitride or silicon oxynitride (SiON), for example. The method of forming the spacer 134a and the spacer 134b includes forming a spacer material layer (not shown) on the substrate 100 by a CVD process, and then removing a portion of the spacer material layer by an anisotropic etching process. Each of the spacers 134a and 134b can be a single layer or a multi-layer structure, and only a single layer is shown in FIG. 1E. The present invention does not limit to this embodiment. According to another embodiment, the first spacer 134a and the second spacer 134b are not formed.

Thereafter, a source region and a drain region (not shown) are formed in the substrate 100 beside the first polysilicon layer 130a. In an embodiment, the method of forming the source region and the drain region includes performing an ion implantation process, for example. When the first area 102 is for forming an NMOS transistor, the source region and the drain region are N-type heavily doped regions. When the first area 102 is for forming a PMOS transistor, the source region and the drain region are P-type heavily doped regions. In another embodiment, the method of forming the source region and the drain region includes removing a portion of the substrate 100 beside the first polysilicon layer 130a to form trenches (not shown), and then performing a selective epitaxial growth (SEG) process. When the first area 102 is for forming an NMOS transistor, the source region and the drain region are SiC epitaxial layers. When the first area 102 is for forming a PMOS transistor, the source region and the drain region are SiGe epitaxial layers.

Figure 1F:
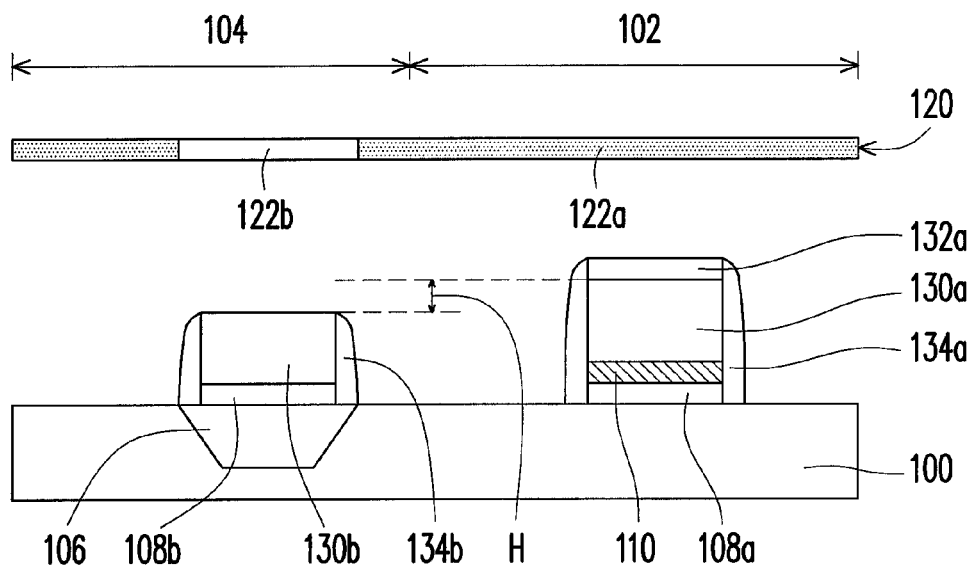

Afterwards, the second hard mask layer 132b on the second polysilicon layer 130b is removed, so as to expose the second polysilicon layer 130b, as shown in FIG. 1F. After the step of removing the second hard mask layer 132b, a portion of the exposed second polysilicon layer 130b is removed, so as to provide a height difference H between the second polysilicon layer 130b and the first polysilicon layer 130a. The height difference H is about 50~500 angstroms, for example. It is noted that the removed portion of the second polysilicon layer 130b is determined depending on the process capability and the device requirement.

According to an embodiment of the present invention, the method of removing the second hard mask layer 132b and the portion of the second polysilicon layer 130b includes installing a photomask 120 above the substrate 100. The photomask 120 has an opaque region 122a and a transparent region 122b. A photoresist layer (not shown) is coated on the substrate 100, and an exposure step with the photomask 120 and a development step are then performed to the photoresist layer. Thereafter, the second hard mask layer 132b and the portion of the second polysilicon layer 130b are removed by using the patterned photoresist layer as a mask. It is noted that the photomask 120 used for removing the second hard mask layer 132b and the portion of the second polysilicon layer 130b in FIG. 1F is the same as the photomask 120 used for patterning the work function layer 110 in FIG. 1B. Further, according to an embodiment of the present invention, the step of removing the second hard mask layer 132b and the step of removing the portion of the second polysilicon layer 130b can be performed in the same etching chamber.

Figure 1G:
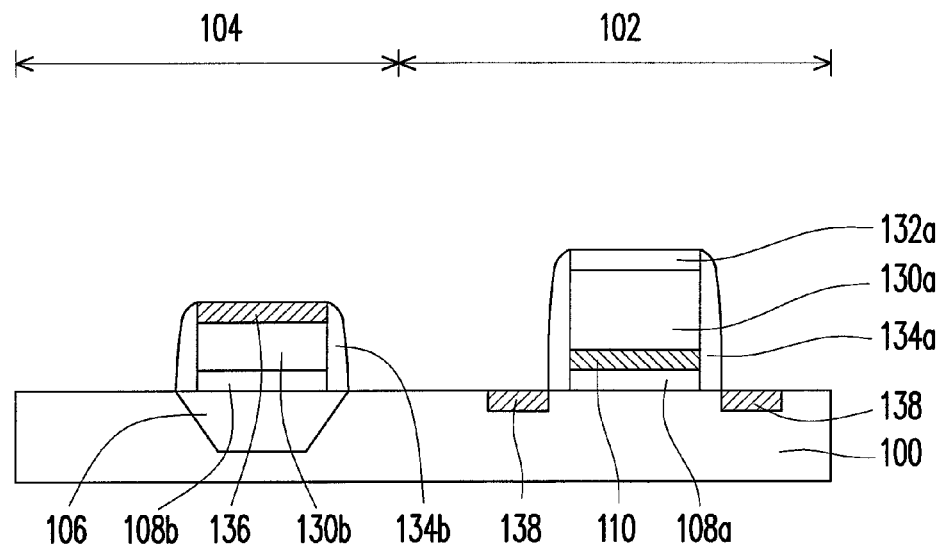

Referring to FIG. 1G, according to a preferred embodiment of the present invention, the method further includes forming a metal silicide layer 136 on the second polysilicon layer 130b, and forming a source and drain metal silicide layer 138 on the surface of the substrate 100 beside the first polysilicon layer 130a. The source and drain metal silicide layer 138 is formed on the surface of the source region and the drain region (not shown) which are previously formed. The method of forming the metal silicide layer 136 and the source and drain metal silicide layer 138 includes forming a metal layer (not shown) on the substrate 100. Thereafter, an annealing process is performed, so that metal silicidation occurs between the metal layer and the second polysilicon layer 130b and between the metal layer and the source and drain regions, and thus, the metal silicide layer 136 is formed on the surface of the second polysilicon layer 130b, and the source and drain metal silicide layer 138 is formed on the surface of the source region and the drain region. Afterwards, the unreacted metal layer is removed. The metal silicide layer 136 and the source and drain metal silicide layer 138 include TiSi, CoSi, NiSi, PtSi, WSi, TaSi, MoSi or a combinations thereof.

Figure 1H:
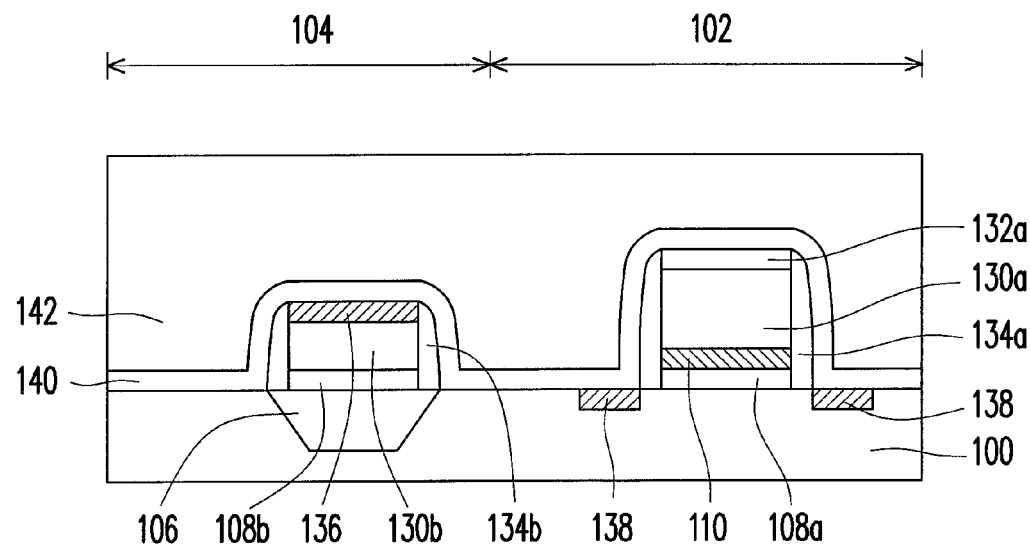

Referring to FIG. 1H, according to a preferred embodiment of the present invention, before the step of forming an interlayer dielectric (ILD) layer, the method further includes optionally forming a protection layer 140 on the substrate 100, so as to cover the formed structures in the first area 102 and the second area 104. The protection layer 140 includes silicon nitride or silicon oxynitride (SiON), and the forming method thereof includes performing a CVD or PVD process, for example. The protection layer 140 conformally covers the surface of the formed structures on the substrate 100 and selectively applies tension stress or compress stress on the NMOS transistor or PMOS transistor. Thereafter, an ILD layer 142 is formed on the protection layer 140. The ILD layer 142 includes SiO, SiN, SiON or a combination thereof, and the forming method thereof includes performing a CVD process, for example.

Referring to FIG. 1I, a planarization process is performed, so as to remove a portion of the interlayer dielectric layer 142 and the protection layer 140 until the surface of the first polysilicon layer 130a is exposed. It is noted that in the previous step in FIG. 1F, a portion of the second polysilicon layer 130b is removed, so that a height difference exist between the first polysilicon layer 130a and the second polysilicon layer 130b. Thus, after the step of performing the planarization process in FIG. 1I, the surface of the first polysilicon layer 130a is exposed while the second polysilicon layer 130b (and the metal silicide layer 136) is not exposed and still covered by the protection layer 140 and the interlayer dielectric layer 142. In this embodiment, the planarization process is a chemical mechanical polishing (CMP) process, for example. The CMP process usually causes dishing or erosion due to the non-uniform polishing between the wafer center and the wafer edge, and thus, in the step in FIG. 1F, the dishing or erosion is taken into consideration when the height difference H and the thickness of the first hard mask layer 132a are designed.

Thereafter, the exposed first polysilicon layer 130a is removed to form an opening 150, as shown in FIG. 1J. The method of removing the first polysilicon layer 130a includes performing an etching process, for example. The second polysilicon layer 130b is unexposed and covered by the protection layer 140 and the interlayer dielectric layer 142, so that removal or peeling of the second polysilicon layer 130b is not observed. Further, according to an embodiment of the present invention, during the step of removing the first polysilicon layer 130a, a portion of the work function layer 110 is removed simultaneously, so that the work function layer 110 in the opening 150 becomes slightly thinner.

Referring to FIG. 1K, since the work function layer 110 in the opening 150 becomes slightly thinner during the step of removing the first polysilicon layer 130a, another work function layer 110a is preferably formed in the opening 150. The material of the work function layer 110a is similar to that of the work function layer 110. The method of forming the work function layer 110a includes performing a deposition process to form the work function layer 110a on the surface of the opening 150 and on the surface of the interlayer dielectric layer 142. Since the work function layer 110 is previously formed at the bottom of the opening 150 (as shown in FIG. 1J), the work function layer 110a is thicker at the bottom than on the sidewall of the opening 150.

Referring to FIG. 1L, a low resistance metal layer 152 is formed in the opening 150. The low resistance metal layer 152 includes Ti, $TiAl_x$, Ti rich TiN, Al or a combinations thereof, for example. The method of forming the low resistance metal layer 152 includes forming a metal material layer (not shown) to cover the interlayer dielectric layer 142 and fill up the opening 150. Thereafter, a CMP process or an etching back process is performed, so as to remove a portion of the metal material layer outside the opening 150 and the work function layer 110a outside the opening 150. Generally speaking, the work function layer 110a and the low resistance metal layer 152 in the opening 150 form a metal gate 153. Thus, a first device 160a and a second device 160b are formed on the substrate 100. Specifically, the first device 160a is a MOS transistor having the metal gate 153, and the second device 160b is a polysilicon resistor having the second polysilicon layer 130b.

After that, a plurality of interconnect layers may be formed on the structure of FIG. 1L to cover the metal gate 153 and the interlayer dielectric layer 142. The plurality of interconnect layers are usually comprised of a plurality of interlayer dielectric layers and a plurality of interconnect structures in the interlayer dielectric layers.

As shown in FIG. 1L, the semiconductor device foamed by the above-mentioned method includes a substrate 100, a first device 160a, a second device 160b and an interlayer dielectric layer 142. According to a preferred embodiment, the semiconductor device further includes an isolation structure 106 and a protection layer 140. The substrate 100 has a first area 102 and a second area 104.

The first device 160a is disposed in the first area 102 of the substrate 100. The first device 160a is a MOS transistor such as an NMOS transistor or a PMOS transistor, for example. The first device 160a includes a first dielectric layer 108a and a metal gate 153, and preferably the first device 160a further comprises a first spacer 134a. In details, the first dielectric layer 108a is disposed on the substrate 100. The metal gate 153 is disposed on the first dielectric layer 108a. The first spacer 134a is disposed on the sidewall of the metal gate 153. According to a preferred embodiment of the present invention, the metal gate 153 comprises a work function layer 110a and a low resistance metal layer 152. The work function layer 110a is disposed between the low resistance metal layer 152 and the first dielectric layer 108a and between the low resistance metal layer 152 and the first spacer 134a. In an embodiment, the work function layer 110 between the low resistance metal layer 152 and the first dielectric layer 108a is thicker than the work function layer 110 between the low resistance metal layer 152 and the first spacer 134a. The first device 160a further includes lightly doped regions (not shown), a source region and a drain region (not shown), and a source and drain metal silicide layer 138. The lightly doped regions (not shown) are in the substrate 100 beside the metal gate 153. The source region and the drain region (not shown) are disposed in the substrate 100 beside the first spacer 134a. The lightly doped regions and the source and drain regions can be N-type or P-type doped regions depending on the conductivity type of the first device 160a. The source and drain metal silicide layer 138 is disposed on the surface of the source region and the drain region.

The second device 106b is disposed in the second area 104 of the substrate 100. In this embodiment, the second device 106b is a polysilicon resistor, for example. The second device 160b includes a second dielectric layer 108b and a second polysilicon layer 130b, and preferably the second device 160b further comprises a second spacer 134b. According to a preferred embodiment of the present invention, the second device 160b further includes a metal silicide layer 136. In details, the second dielectric layer 108b is disposed on the substrate 100. The second polysilicon layer 130b is disposed on the second dielectric layer 108b, and the height of the second polysilicon layer 130b is less than that of the metal gate 152 of the first device 160a. According to a preferred embodiment of the present invention, the height difference between the second polysilicon layer 130b and the metal gate 153 of the first device 160a is about 50~500 angstroms. In other words, the difference between the top surface of the second polysilicon layer 130b and that of the metal gate 153 is about 50~500 angstroms. When the metal silicide layer 136 is formed on the second polysilicon layer 130b, the height difference between the metal silicide layer 136 and the metal gate 153 of the first device 160a is about 50~500 angstroms. In other words, the difference between the top surface of the metal silicide layer 136 and that of the metal gate 153 is about 50~500 angstroms. Further, the second spacer 134b is disposed on the sidewall of the second polysilicon layer 130b.

The interlayer dielectric layer 142 covers the second device 160b but exposes the metal gate 153 of the first device 160a.

The isolation structure 106 is disposed in the substrate 100 in the second area 104. According to an embodiment of the present invention, the second device 160b is disposed on the isolation structure 106. Further, the protection layer 140 covers the second device 160b and is disposed between the interlayer dielectric layer 142 and the second device 160b. Specifically, the protection layer 140 covers the first spacer 134a of the first device 160a but exposes the metal gate 153 of the first device 160a.

According to an embodiment, a plurality of interconnect layers may be disposed on the structure of FIG. 1L to cover the metal gate 153 and the interlayer dielectric layer 142. The plurality of interconnect layers are usually comprised of a plurality of interlayer dielectric layers and a plurality of interconnect structures in the interlayer dielectric layers.

As shown in FIG. 1L, the semiconductor device in which the first device 160a (a MOS transistor) is disposed in the first area 102 and the second device 160b (a polysilicon resistor) is disposed in the second area 104 is provided for illustration purposes, and is not construed as limiting the present invention. According to another embodiment, another device can also be disposed in the second area 104, as shown in FIG. 2.

Figure 2:
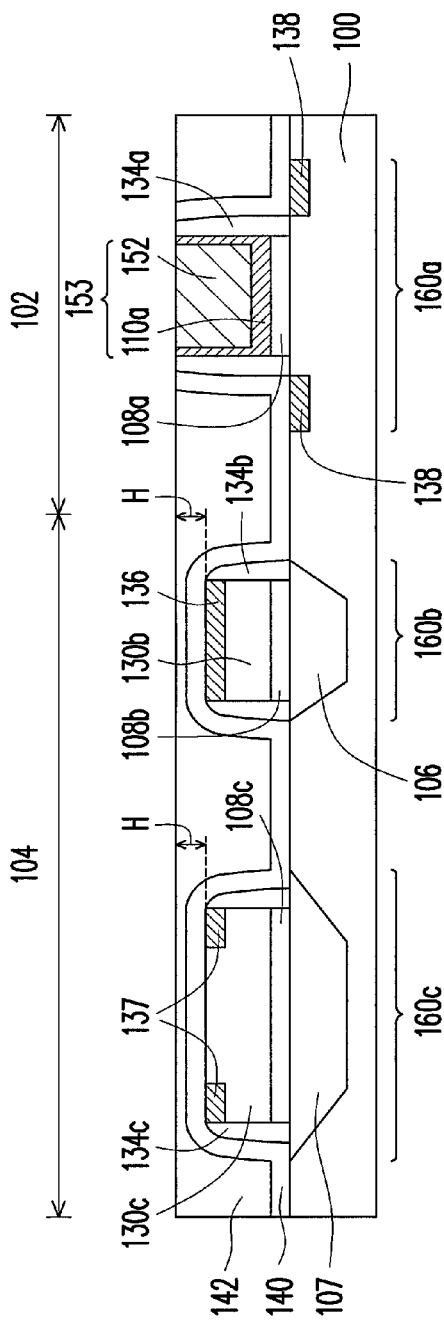
FIG. 2 schematically illustrates a cross-sectional view of a semiconductor device according to another embodiment of the present invention.

Referring to FIG. 2, the embodiment of FIG. 2 is similar to that of FIG. 1L, so that the same elements or structures are given the same reference numbers and details are not iterated herein. The difference between the embodiment of FIG. 2 and that of FIG. 1L lies in that the semiconductor device of FIG. 2 further includes a third device 160c and an isolation structure 107 disposed in the second area 104. The isolation structure 107 is disposed in the substrate 100 in the second area 104. In this embodiment, the third device 160c is a polysilicon fuse, for example. The third device 160c includes a third dielectric layer 108c and a third polysilicon layer 130c, and preferably the third device 160c further comprises a third spacer 134c. According to a preferred embodiment of the present invention, the third device 160c further includes a metal silicide layer 137. In details, the third dielectric layer 108c is disposed on the substrate 100. The third polysilicon layer 130c is disposed on the third dielectric layer 108c, and the height of the third polysilicon layer 130c is less than that of the metal gate 153 of the first device 160a. According to a preferred embodiment of the present invention, the height difference between the third polysilicon layer 130c and the metal gate 153 of the first device 160a is about 50~500 angstroms. Further, the third spacer 134c is disposed on the sidewall of the third polysilicon layer 130c. Similarly, the interlayer dielectric layer 142 covers the third device 160c but exposes the metal gate 153 of the first device 160a. The protection layer 140 covers the third device 160c and is disposed between the interlayer dielectric layer 142 and the third device 160c.

Figure 3:
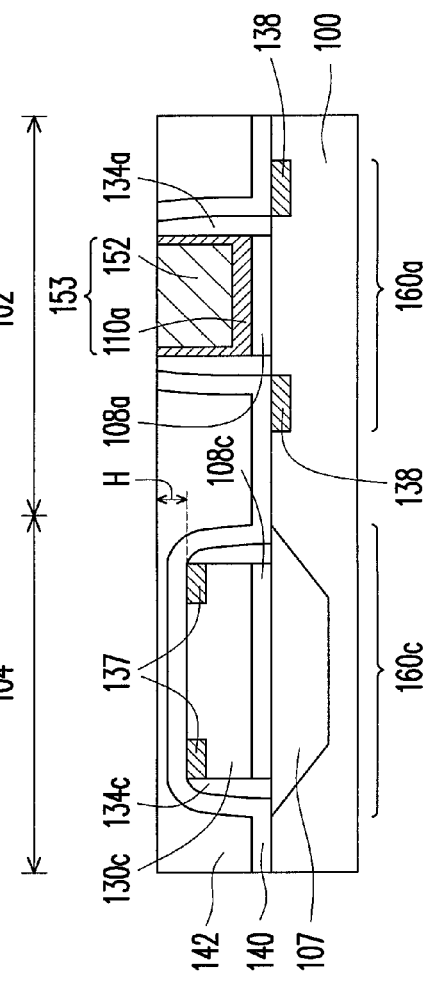
FIG. 3 schematically illustrates a cross-sectional view of a semiconductor device according to another embodiment of the present invention.

As shown in FIG. 2, the semiconductor device in which the first device 160a (a MOS transistor) is disposed in the first area 102 and the second device 160b (a polysilicon resistor) and the third device 160c (a polysilicon fuse) are disposed in the second area 104 is provided for illustration purposes, and is not construed as limiting the present invention. According to another embodiment, only the third device 160c (a polysilicon fuse) is disposed in the second area 104, as shown in FIG. 3. Similarly, the height of the third polysilicon layer 130c is less than that of the metal gate 153 of the first device 160a. According to a preferred embodiment of the present invention, the height difference between the third polysilicon layer 130c and the metal gate 152 of the first device 160a is about 50~500 angstroms.

The forming method of the third device 160c as shown in FIGS. 2 and 3 is the same as or similar to that of the second device 160b. In other words, in FIG. 1A, during the step of forming the isolation structure 106, the isolation structure 107 below the third device 160c is formed simultaneously. During the patterning process in FIG. 1D, the third dielectric layer 108c and the third polysilicon layer 130c, which are also called a third stacked pattern, of the third device 160c are formed simultaneously. During the step in FIG. 1E, the third spacer 134c of the third device 160c is formed simultaneously. During the step in FIG. 1F, a portion of the third polysilicon layer 130c of the third device 160c is removed simultaneously. During the step in FIG. 1G, the metal silicide layer 137 of the third device 160c is formed simultaneously. During the step in FIG. 1H, the formed protection layer 140 and the interlayer dielectric layer 142 also covers the third device 160c at the same time. Therefore, people of ordinary skill in the art are able to practice the method of forming the third device 160c as referred to FIGS. 1A to 1L.

In summary, in the present invention, a polysilicon resistor and/or a polysilicon fuse and a MOS transistor having a metal gate can be formed simultaneously on the substrate. Therefore, not only the better device performance of the MOS transistor is obtained but also the IC design requirement of the resistor and/or fuse is satisfied. Further, the height of the metal gate of the MOS transistor is more than that of the polysilicon layer of the polysilicon resistor and/or the polysilicon fuse, so that peeling of the polysilicon resistor and/or the polysilicon fuse during the manufacturing process can be avoided.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of forming a semiconductor device, comprising:
    providing a substrate having a first area and a second area;
    forming a first stacked pattern comprising a first dielectric layer and a first polysilicon layer in the first area, and forming a second stacked pattern comprising a second dielectric layer and a second polysilicon layer in the second area, wherein the first polysilicon layer and the second dielectric layer have a same thickness;
    thinning the second polysilicon layer to obtain a thinned second polysilicon layer;
    forming an interlayer dielectric layer on the substrate;
    performing a planarization process, so as to remove a portion of the interlayer dielectric layer until a surface of the first stacked pattern in the first area is exposed;
    removing the exposed first stacked pattern in the first area to form an opening; and
    forming a metal gate in the opening, wherein the thinned second polysilicon layer has a height less than that of the metal gate.

2. The method of claim 1, wherein the steps of forming the first stacked pattern in the first area and forming the second stacked pattern in the second area comprise:
    sequentially forming a dielectric layer and a polysilicon layer on the substrate;
    pattering the polysilicon layer and the dielectric layer, so as to form the first dielectric layer and the first polysilicon layer in the first area and form the second dielectric layer and the second polysilicon layer in the second area.

3. The method of claim 2, wherein the height difference between the second polysilicon layer and the first polysilicon layer is 50~500 angstroms.

4. The method of claim 2, further comprising:
    forming a first hard mask layer and a second hard mask layer respectively on the first polysilicon layer and the second polysilicon layer;
    removing the second hard mask layer before the step of removing the portion of the second polysilicon layer; and
    removing the first hard mask layer during the step of performing the planarization process.

5. The method of claim 4, further comprising, after the step of removing the second hard mask layer, forming a metal silicide layer on the second polysilicon layer and forming a source and drain metal silicide layer on a surface of the substrate beside the metal gate.

6. The method of claim 4, further comprising forming a work function layer between the dielectric layer and the polysilicon layer.

7. The method of claim 6, further comprising patterning the work function layer before the step of forming the polysilicon layer.

8. The method of claim 7, wherein the step of patterning the work function layer and the step of removing the second hard mask layer use the same photomask.

9. The method claim 2, further comprising, after the step of removing the exposed first stacked pattern in the first area to form the opening, forming a work function layer on a surface of the opening.

10. The method of claim 2, further comprising, before the step of forming the interlayer dielectric layer, forming a protection layer on the first polysilicon layer and the second polysilicon layer.

11. The method of claim 10, further comprising, during the step of performing the planarization process, removing the protection layer on the first polysilicon layer.

12. The method of claim 1, further comprising forming a third stacked pattern comprising a third dielectric layer and a third polysilicon layer in the second area, wherein the third stacked pattern has a height different from that of the first stacked pattern.

13. The method of claim 12, wherein the steps of forming the third stacked pattern in the second area comprise:
    forming a third dielectric layer and a third polysilicon layer in the second area during the step of patterning the dielectric layer and the polysilicon layer; and
    removing a portion of the third polysilicon layer so as to provide a height difference between the third polysilicon layer and a first polysilicon layer during the step of removing the portion of the second polysilicon layer,
    wherein the interlayer dielectric layer further covers the third polysilicon layer.

14. The method of claim 12, wherein the height difference between the third polysilicon layer and the first polysilicon layer is 250~500 angstroms.

15. The method of claim 12, further comprising:
    forming a first spacer on a sidewall of the first polysilicon layer;
    forming a second spacer on a sidewall of the second polysilicon layer; and
    forming a third spacer on a sidewall of the third polysilicon layer.

16. A semiconductor device, comprising:
    a substrate, having a first area and a second area;
    a first device, disposed in the first area of the substrate and comprising:
        a first dielectric layer, disposed on the substrate; and
        a metal gate, disposed on the first dielectric layer, and comprising a work function layer and a low resistance metal layer, wherein the work function layer is disposed between the low resistance metal layer and the first dielectric layer;

a second device, disposed in the second area of the substrate and comprising:
- a second dielectric layer, disposed on the substrate;
- a first polysilicon layer, disposed on the second dielectric layer; and
- a metal silicide layer, disposed directly on the first polysilicon layer, wherein a height of the first polysilicon layer is less than a height of the metal gate of the first device; and
- an interlayer dielectric layer, covering the second device.

17. The semiconductor device of claim 1, wherein a height difference between the metal gate of the first device and the first polysilicon layer of the second device is 50~500 angstroms.

18. The semiconductor device of claim 1, further comprising a third device disposed in the second area of the substrate comprising:
- a third dielectric layer, disposed on the substrate; and
- a second polysilicon layer, disposed on the third dielectric layer, wherein a height of the second polysilicon layer is less than the height of the metal gate of the first device, wherein the interlayer dielectric layer covers the third device.

19. The semiconductor device of claim 18, wherein a height difference between the metal gate of the first device and the second polysilicon layer of the third device is 50~500 angstroms.

20. The semiconductor device of claim 18, wherein the first device is a MOS transistor, the second device is one of a resistor and a fuse, and the third device is the other one of the resistor and the fuse.

21. The semiconductor device of claim 18, wherein:
- the first device further comprises a first spacer, disposed on a sidewall of the metal gate;
- the second device further comprises a second spacer, disposed on a sidewall of the first polysilicon layer; and
- the third device further comprises a third spacer, disposed on a sidewall of the second polysilicon layer.

22. The semiconductor device of claim 1, wherein the first device further comprises a source and drain metal silicide layer disposed on a surface of the substrate beside the metal gate.

23. The semiconductor device of claim 1, further comprising a protection layer covering the second device and disposed between the interlayer dielectric layer and the second device.

* * * * *